United States Patent [19]

Carey

[11] Patent Number: 5,272,600
[45] Date of Patent: Dec. 21, 1993

[54] ELECTRICAL INTERCONNECT DEVICE WITH INTERWOVEN POWER AND GROUND LINES AND CAPACITIVE VIAS

[75] Inventor: David H. Carey, Austin, Tex.

[73] Assignee: Microelectronics And Computer Technology Corporation, Austin, Tex.

[21] Appl. No.: 939,228

[22] Filed: Sep. 2, 1992

[51] Int. Cl.$^5$ .............................................. H05K 1/14
[52] U.S. Cl. .................................... 361/792; 361/738; 361/748; 361/803; 174/255; 257/698
[58] Field of Search .............. 361/396, 397, 400, 401, 361/403, 412, 414, 417, 419, 420; 174/255, 261, 254, 260; 257/678, 684, 698, 723, 700

[56] References Cited

U.S. PATENT DOCUMENTS

| | | | |
|---|---|---|---|
| 4,072,816 | 2/1978 | Gedney et al. | 174/52 |
| 4,225,900 | 9/1980 | Ciccio et al. | 361/375 |
| 4,332,778 | 3/1982 | Barbour et al. | 361/414 |
| 4,628,411 | 12/1986 | Balderes et al. | 361/414 |
| 4,685,033 | 8/1987 | Inoue | 361/414 |
| 4,803,595 | 2/1989 | Kraus et al. | 361/412 |
| 4,811,076 | 3/1989 | Tigelaar et al. | 357/51 |
| 4,816,323 | 3/1989 | Inoue | 428/200 |
| 4,816,894 | 3/1989 | Hattori | 357/51 |
| 4,866,507 | 9/1989 | Jacobs et al. | 357/74 |
| 5,136,471 | 8/1992 | Inasaka | 361/414 |
| 5,155,302 | 10/1992 | Nguyen | 174/88 R |
| 5,177,594 | 1/1993 | Chance et al. | 257/678 |

FOREIGN PATENT DOCUMENTS

0045877A1 7/1981 European Pat. Off. .
2096281A 3/1982 United Kingdom .

OTHER PUBLICATIONS

U.S. Ser. No. 07/605,806 filed Oct. 30, 1990.
U.S. Ser. No. 07/840,428 filed Feb. 24, 1992.
"Low-Cost Multichip Modules Push Limits of Packaging", Electronic Design International, Jul. 1990.
Anderson et al., "Surface Mount Design and Assembly for High Density Complex Modules," 6th Annual International Electronics Packaging Society Conference, San Diego, Calif, Nov. 17–19, 1986, pp. 404–416.

Primary Examiner—Lincoln Donovan
Assistant Examiner—Young Whang
Attorney, Agent, or Firm—David M. Sigmond

[57] ABSTRACT

The invention relates to an electrical interconnect device with power and ground lines interwoven about signal line layers and capacitive vias between signal layers so as to make efficient use of otherwise undedicated area between signal lines and signal layers and to reduce or eliminate the need for separate power and ground layers while providing decoupling capacitance within the wiring structure.

23 Claims, 3 Drawing Sheets

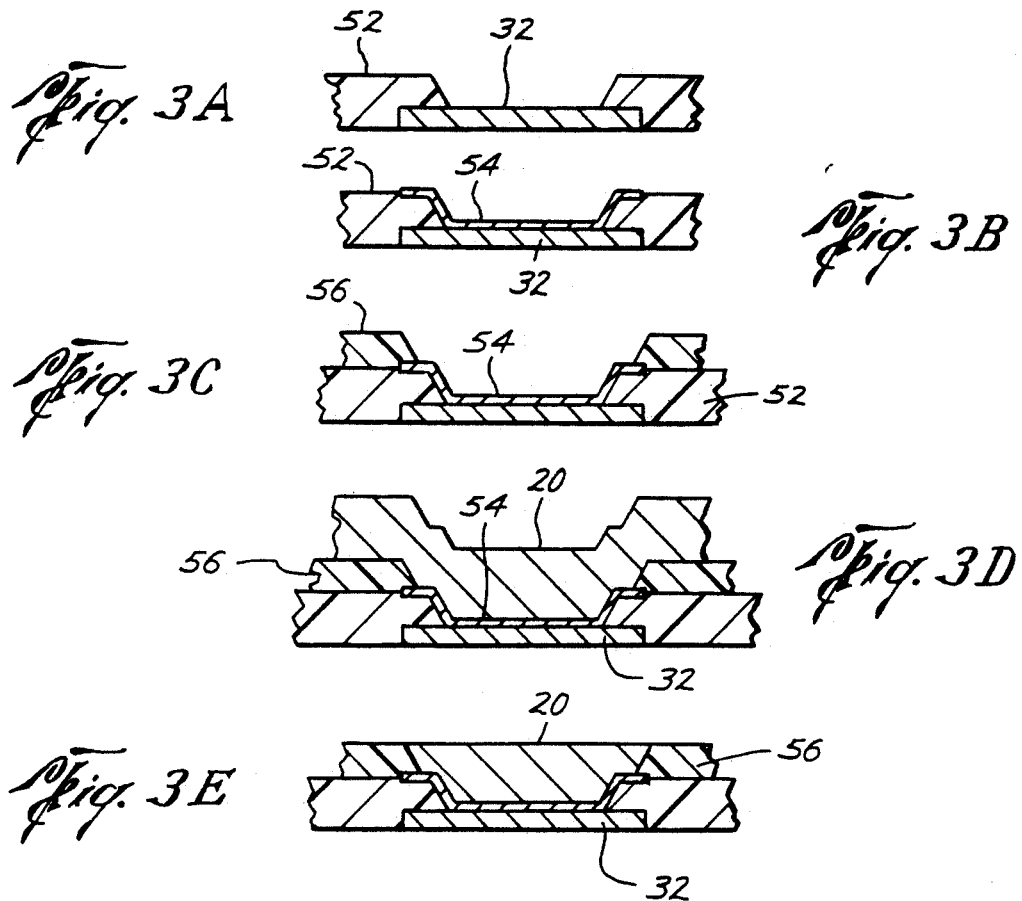

ELECTRICAL INTERCONNECT DEVICE WITH INTERWOVEN POWER AND GROUND LINES AND CAPACITIVE VIAS

BACKGROUND OF THE INVENTION

1. Field of the Invention

The invention relates to a multilayer wiring device for packaging integrated circuit chips, and more particularly to an electrical interconnect device with power and ground lines interwoven about signal line layers and capacitive vias between signal layers so as to make efficient use of the signal layer surface area and interlayer space and provide decoupling capacitance while reducing or eliminating the need for separate power and ground layers and external capacitors.

2. Description of Related Art

In the manufacture of integrated circuits, silicon wafers containing many individual integrated circuits are fabricated and then the wafers are cut into individual integrated circuit chips or die. The chips are subsequently packaged and interconnected to other electrical components. During packaging, electrically conductive metal leads can be bonded between a chip and an interconnect substrate to provide proper electrical interconnection between different chips.

Current multi-chip circuitry design requires the attachment of numerous integrated circuit chips to high density electrical interconnects, also known as multi-chip modules (MCMs) or as substrates. The electrical interconnects normally include surface pads for bonding to surface mounted chips, a dielectric, and electrical lines buried in the dielectric for connecting selected pads to provide electrical routing between various bond sites on the chips. It is common to use copper for the buried lines and polyimide as the dielectric. The copper lines may form separate layers of orthogonal wiring sets that are interconnected to one another and to surface pads by vertical conductive vias such as metal pillars.

As integrated circuit technology advances towards even larger scale integration and high performance circuits, the number of drivers which can switch simultaneously on a chip also increases. This imposes stringent requirements on the power supply system which has to supply high current transients during short time intervals without causing any noise signals in the power distribution system. Noise signals can propagate in the power distribution system and cause false switching if they reach quiescent drivers.

Accordingly, there are typically two functions accomplished in a multilayer interconnect structure. One is the electrical performance such as power distribution (e.g. by power and ground lines), impedance matching and minimal cross talk. The other is the actual interconnect or signal routing. Conventional multilayer structures generally separate these functions into distinct layers. Some layers are assigned to power distribution, other layers to signal routing. An example of prior art multilayer wiring substrates with a plurality of power supply layers formed within the substrates is disclosed in U.S. Pat. No. 4,816,323 to Inoue entitled "Multilayer Wiring Substrate." Power distribution layers often serve as reference planes for the signals in order to create a transmission line environment with controlled impedances. But having separate layers reduces the effectiveness of power distribution in stripline environments. In addition, power distribution layers are often produced with very course granularity as relatively simple structures in metal planes with little or no fine feature patterning. This results in a cost penalty for producing a relatively simple structure with a complicated process.

Attempts have been made to solve this problem by producing power and ground layers in a technology different than that used to produce the routing or signal layers. An example is thin film wiring layers on a co-fired ceramic base. Co-fired ceramic can produce coarse geometies with relatively low cost, particularly by fabricating simple layers with simple processes and complex layers with complex processes. Copper-polyimide on co-fired ceramic is an example.

Another key aspect of electrical interconnect devices is impedance control. There are three basic ways to achieve a controlled impedance environment for a conductor. The first is a microstrip, which is generally a single ground or reference plane above or below the conductor. The second is a strip line, in which the conductor is sandwiched between two reference planes, for instance one above and one below. And the third is co-planar wave guide, in which reference planes are closely positioned on either side of the conductor.

Furthermore, as electrical interconnect devices achieve fine geometries, narrow signal lines with wide spaces therebetween become necessary to prevent cross-talk between adjacent signal lines. As a result, the fraction of area on a typical routing layer that contains metal becomes quite small. That is, routing layers fabricated by precise design rules suffer low surface area utilization with much non-metallized topology in order to electrically accommodate the fine signal lines. But for greater produceability there should be as few metallization layers as possible.

Various approaches to providing power distribution systems in multilayer wiring substrates are as follows:

U.S. Pat. No. 4,072,816 by Gedney et al. entitled "Integrated Circuit Package" discloses a prepunched copper-dielectric laminate ground plane assembly placed on a ceramic substrate around surface mounted components. The ground plane is connected to selected circuit connection pins by welding or soldering.

U.S. Pat. No. 4,322,778 to Barbour et al. entitled "High Performance Semiconductor Packaging Assembly" discloses a power supply distribution system consisting of a radial waveguide structure with parallel waveguide planes located between signal fan-out wiring and internal wiring metallurgy.

U.S. Pat. No. 4,628,411 by Balderes et al. entitled "Apparatus For Directly Powering A Multi-Chip Module From A Power Distribution Bus" discloses a module powered directly from a power distribution bus via voltage tabs mounted on the edge of the module rather than from the bus via power distribution planes within the board.

U.S. Pat. No. 4,866,507 to Jacobs et al. entitled "Module for Packaging Semiconductor Integrated Circuit Chips On A Base" discloses thin film wiring layers having coplanar signal, power and ground lines with at least one power or ground line existing between coplanar signal lines to minimize cross talk. To facilitate power distribution, lines of specific power levels of the patterned planes are connected to lines of the same power level on other patterned planes. While Jacobs et al. represents a significant advance over the art of record, there still remains portions of unused space, in particular between power and ground lines in separate planes. Furthermore, decoupling capacitors are described as being incorporated either on the top surface of the module or in the base substrate itself by appropriately doping the base substrate. That is, Jacobs fails to describe how capacitors can be located within the existing wiring structure.

As a result, there exists a need for an electrical interconnect device that achieves a reduction of power distribution layers and/or an increased signal layer area utilization while also providing adequate impedance control and decoupling capacitance.

SUMMARY OF THE INVENTION

The present invention is directed to an electrical interconnect device structure that makes use of unused areas between signal lines and signal planes by interweaving power distribution lines and capacitive vias in such areas. The specific structure of the present invention is based on the fact that some of the most efficient routing topologies are achieved by an XY matrix or mesh of narrow lines with wide spaces therebetween. Such wire meshes exhibit structural regularity, including a regularity of unfilled area between the lines and between the planes. The present invention takes advantage of this regularity by locating fairly course power distribution features and capacitive vias in the unfilled areas.

Accordingly, an object of the present invention is to reduce electrical interconnect device fabrication costs through reduction of the number of process steps that need be performed to fabricate signal lines, power distribution lines and decoupling capacitors.

A further object of the present invention is to combine signal routing, power distribution, decoupling capacitors and transmission line capability into as few layers as possible with a common manufacturing method.

Another object of the present invention is to interweave a power-ground matrix and interlayer capacitive vias in the regular unused area of a wiring matrix so as to make relatively high surface area utilization of layers dedicated to metal.

A still further object of the present invention is to provide an interconnect device with a well-controlled impedance environment with low power distribution resistance and high capacitance between power distribution metallization levels.

In accordance with one aspect of the present invention, there is provided an electrical interconnect device having a supportive base, alternating insulating and metallization layers and adapted to receive semiconductor integrated circuit chips mounted thereon comprising a plurality of spaced, parallel, metal first electrical signal lines in a first plane, a plurality of spaced, parallel, metallic second electrical signal lines in a second plane with the second plane planar with the first plane and the second signal lines positioned beneath, spaced from and orthogonal to the first signal lines, a plurality of spaced, parallel, metallic first power lines in the first plane arranged parallel to and spaced from the first signal lines, a plurality of spaced, parallel, metallic second power lines in the second plane arranged parallel to and spaced from the second signal lines, a plurality of spaced, parallel, metallic first ground lines in the first plane arranged parallel to and spaced from the first signal and first power lines, a plurality of spaced, parallel, metallic second ground lines in the second plane arranged parallel to and spaced from the second signal and second power lines, a plurality of conductive, vertical signal vias located between and connecting selected first and second signal lines, a plurality of conductive, vertical power vias located between and connecting substantially all first and second power lines, a plurality of conductive, vertical ground vias located between and connecting substantially all first and second ground lines, and a plurality of vertical, capacitive vias located between and connecting substantially all power lines in one plane to ground lines in the other plane.

In a particularly preferred embodiment, each signal line between at least two other signal lines in the same plane is adjacent to a power line and a ground line in the same plane, each power line between at least two other power lines in the same plane is between and adjacent to two signal lines in the same plane, each ground line between at least two other ground lines in the same plane is between and adjacent to two signal lines in the same plane, the signal vias are located where selected first and second signal lines overlap, the power vias are located where all first and second power lines overlap, the ground vias are located where all first and second ground lines overlap, and the capacitive vias are located where all first power lines and second ground lines overlap and where all second power lines and first ground lines overlap.

A primary advantage of the present invention is the value added by making high utilization of surface area on signal layers by using otherwise undedicated space between signal lines and between the planes and the consequential reduction or elimination of the need for separate power and/or ground layers or capacitors outside the wiring structure.

These and other objects, features and advantages of the present invention will be further described and more readily apparent from a review of the detailed description and preferred embodiments which follow.

BRIEF DESCRIPTION OF THE DRAWINGS

The following detailed description of the preferred embodiments can best be understood when read in conjunction with the following drawings, wherein.

DETAILED DESCRIPTION OF THE PREFERRED EMBODIMENTS

Figure 1:
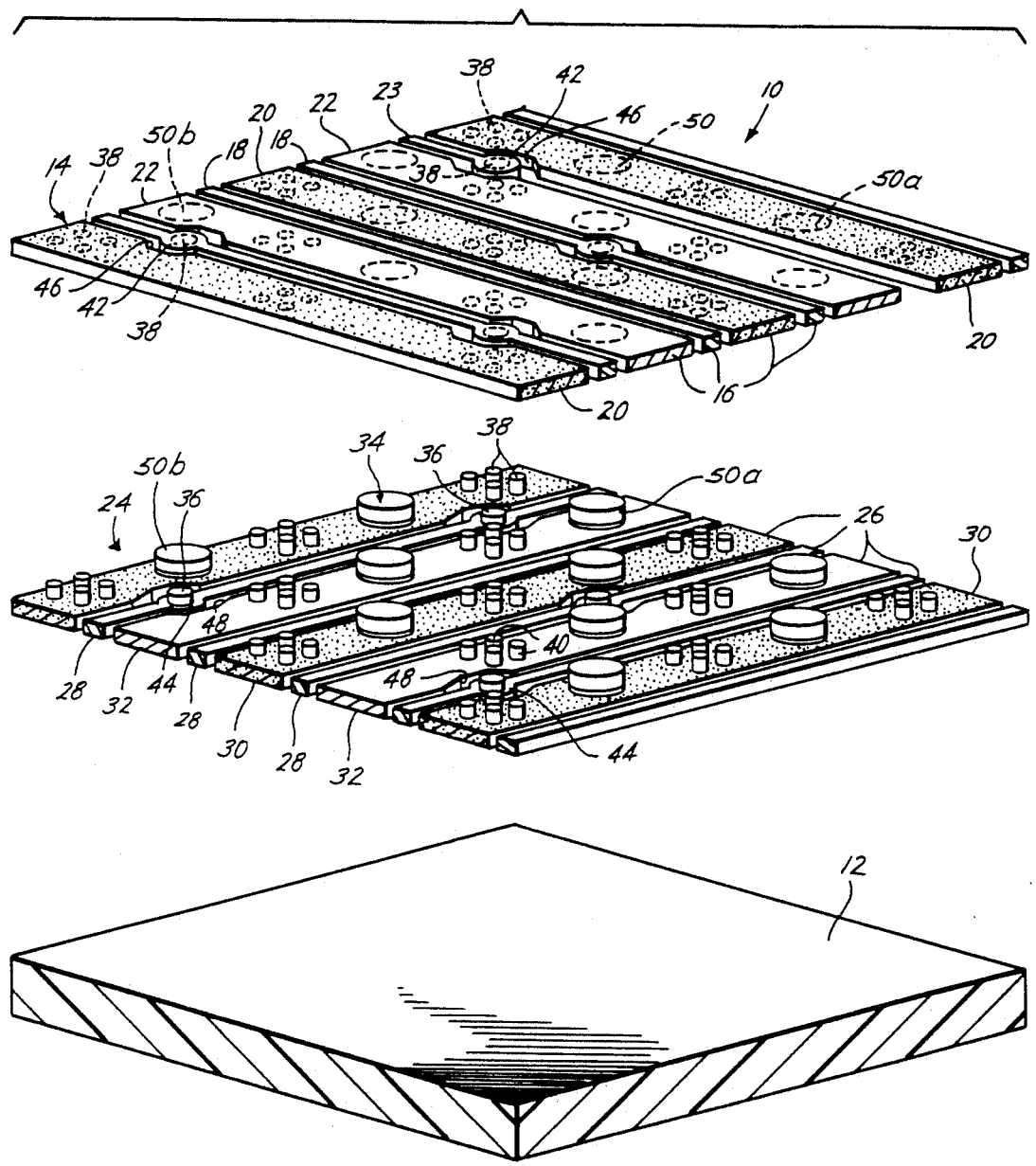
FIG. 1 shows an exploded isometric projection of an electrical interconnect device of the present invention.
Figure 2:
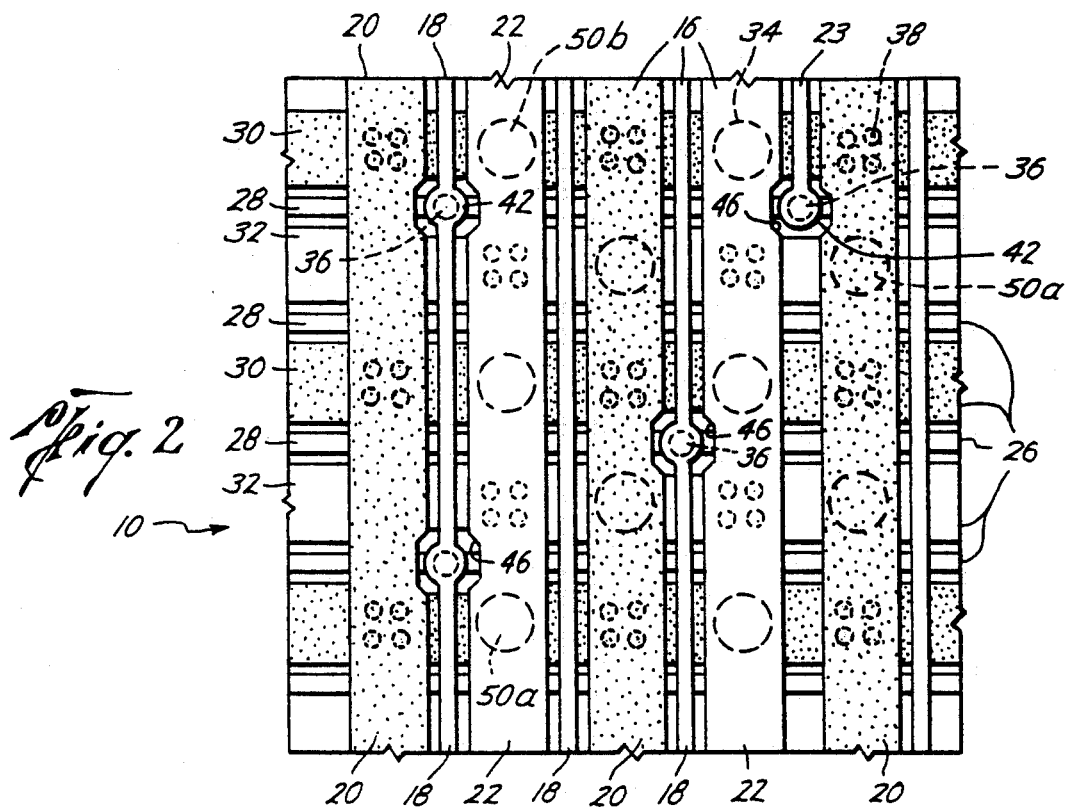
FIG. 2 shows a top plan view of the device of FIG. 1, FIGS. 3A-3E show cross-sectional views of process steps for forming capacitive vias between power lines in one plane and ground lines in another plane.

Referring now to the drawings wherein depicted elements are not necessarily shown to scale and wherein like or similar elements are designated by the same reference numeral through the several views and, more particularly to FIGS. 1 and 2, there is shown a copper-polyimide electrical interconnect device generally designated 10 according to a particularly preferred exemplification of the invention. Base 12 is shown as a ceramic such as alumina ceramic or glass ceramic, however, it is understood that the supportive base 12 can be an organic or inorganic insulator, silicon, a conductor, an integrated circuit, or a preceding layer if the interconnect is a multilayer structure. Base 12 may require appropriate surface preparation, such as polishing, cleaning, etching, or roughening to assure acceptable contamination removal and/or surface finish. For example, it may be advantageous to roughen a copper-polyimide base by plasma cleaning, or to smoothen a ceramic, plastic, or metal base by polishing.

Positioned above and planar with base 12 is a first upper plane 14. Plane 14 comprises X- level wiring seen as a plurality of spaced, elongated, parallel conductive metal lines denoted first lines 16. First lines 16 comprise first signal lines 18, power lines 20 at a bias voltage (e.g. 5 volts) and first ground lines 22. As may be seen, each first signal line 18 between at least two other signal lines 18 is between and adjacent to a first power line 20 and a first ground line 22. Furthermore, each first power line 20 between at least two other first power lines 20 is between and adjacent to two first signal lines 18, and each first ground line 22 between at least two other ground lines 22 is between and adjacent to two first signal lines 18. As a result, the first lines 16 are positioned so as to form a regular pattern of (1) first signal line 18, (2) first power line 20, (3) first signal line 18, and (4) first ground line 22 as traversed in a direction orthogonal to the lines. Additionally, as is seen, first lines 16 occupy the majority of the surface area of first plane 14. It is also noted that the signal lines need not necessarily extend the entire length of device 10, as illustrated by signal line 23.

Positioned between and planar with base 12 and first plane 14 is second lower plane 24. Second plane 24 comprises Y- level wiring seen as a plurality of spaced, elongated, parallel conductive metal lines denoted second lines 26. Second lines 26 are positioned beneath, spaced from, and orthogonal to first lines 16. Second lines 26 comprise second signal lines 28, second power lines 30 at the same bias voltage as lines 20, and second ground lines 32. The relative positions of the signal, power and ground lines in the second plane are similar to that of the first plane. That is, each second signal line 28 between at least two other signal lines 28 is between and adjacent to a second power line 30 and a second ground line 32. In addition, each second power line 30 between at least two other second power lines 30 is between and adjacent to two second signal lines 28, and each second ground line 32 between at least two other ground lines 32 is between and adjacent to two second signal lines 18. As a result, a regular pattern of (1) second signal line 28, (2) second power line 30, (3) second signal line 28, and (4) second ground line 32 emerges as the second lines are traversed in the direction of the first lines. Also, second lines 26 occupy the majority of the surface area of second plane 24.

Device 10 further comprises a plurality of vertical, conductive vias 34 for connecting first lines 16 to the second lines 26. Vias 34 are shown as pillar-type configurations located at the overlapping regions of the first and second lines. Vias 34 comprise signal vias 36 for connecting first signal lines 18 to second signal lines 28, power vias 38 for connecting first power lines 18 to second power lines 30, and ground vias 40 for connecting first ground lines 22 to second ground lines 32. Preferably, selected first signal lines 18 are connected to selected second signal lines 28 to effect a customized routing configuration whereas all of the first power lines 20 are connected to the second power lines 30 and all of the first ground lines 22 are connected to the second ground lines 32. Vias 36, 38 and 40 may be the same metallurgy as the wiring, i.e. copper. Although not shown, the vias may alternatively be stepped conductive vias with underlaying mounds of dielectric beneath and supporting protruding portions of the lines. In addition, optional signal line capture pads 42 and 44 integral with first and second signal lines 18 and 28, respectively, may be included to facilitate aligning the thin signal lines with the signal vias 38 during manufacture. To accommodate capture pads 42, minor cut outs or nicks 46 may be made in adjacent regions of the first power and ground lines; likewise, nicks 48 may be made in the second power and ground lines to accommodate capture pads 44. Power vias 38 and ground vias 40 are shown as arrays of four small vias mounted on the second power and ground lines, respectively, at appropriate overlap regions. Four vias are used instead of one both to illustrate that a plurality of vias may be used within any of the overlapping regions of lines 16 and 26 and to more easily distinguish the power and ground vias from the signal and capacitive vias. The broken lines or dashes in first lines 16 depict the location of connection with the underlying vias. Hence the arrangement of power and ground lines in device 10 is seen to provide a two dimensional mesh of power lines and ground lines. This interwoven set of power and ground lines provides relatively low resistance and numerous potential paths for current to flow.

It is desirable to have capacitive loading between power and ground planes. In fact, power distribution performance degradation may occur from "ground bounce" in the absence of a continuous dedicated power or ground plane which tends to provide greater parallel plate capacitance than features which share space with signal lines. Nonetheless, this disadvantage may be mitigated without dedicated planes. U.S. Pat. No. 4,866,507 by Jacobs et al. discussed in the background hereinabove proposes incorporating decoupling capacitors either on the top surface of the device or in the base itself by appropriately doping the base. This, however, requires adding to the number of layers that need to be processed as it fails to integrate the capacitors into the wiring structure itself. The present invention discloses the inclusion of decoupling capacitors as an integral part of the wiring structure by forming capacitive vias between the power lines in one plane and the ground lines in the other plane. Such capacitive vias not only reduce or obviate the need for fabricating capacitors outside the wiring layers, but also make use of otherwise unused space between overlapping power and ground lines thereby providing an even more compact and efficient device. With capacitive vias the crossovers between lines of differing voltages provide a decoupling or parallel plate relationship which both increases the capacitance and lowers the impedance of the power distribution structure thereby improving the dynamic switching capability of the device. In other words, the capacitive vias provide improved ac coupling with multiple ac current paths in addition to the power and ground vias which provide improved dc coupling with multiple dc current paths.

Referring still to FIGS. 1 and 2, device 10 further includes integrated capacitors or capacitive vias 50 between the power and ground lines on separate planes, shown as capacitive vias 50a between first power lines 20 and second ground lines 32, and capacitive vias 50b between second power lines 30 and first ground lines 22. Capacitive vias 50 effectively bring the crossover points between the overlapping power and ground lines closer together in an electrical sense to provide more decoupling capacitance between the planes.

FIGS. 3A-3E show sequential fabrication steps in cross-section of a bilevel trench process for forming the capacitive vias between the first and second lines. The process is shown as depositing a first patterned layer of polyimide 52 on a second ground line 32 that exposes a portion of line 32 (FIG. 3A), depositing a thin capacitor dielectric 54 on polyimide 52 and line 32 (FIG. 3B), depositing a second patterned layer of polyimide 56 on polyimide 52 that exposes dielectric 54 (FIG. 3C), depositing metal from first metal power line 20 on dielectric 54 and polyimide 56 (FIG. 3D), and planarizing the device as by polishing so that line 20 is in and aligned with the top surface of polyimide 56 (FIG. 3E). Of course the forementioned process is applicable to forming capacitive vias 50b on second power lines 30 and forming first ground lines 22 on vias 50b. Furthermore, other conventional processes are adaptable for forming the capacitive vias of the present invention. For instance, the polyimide may be patterned by a wet etch, dry etch or photoimaging; the metallization may be deposited by sputtering, evaporation, chemical vapor deposition or plating. Suitable dielectrics include silicon dioxide, silicon nitride, tantalum pentoxide, barium titante, or other insulators formed by sputtering, chemical vapor deposition or anodization.

With respect to dimensions, the signal lines may be 15 microns wide, the power and ground lines may be 50-60 microns wide, and the horizontal spacings between adjacent lines in a plane may be 5-10 microns. All lines may be 5-10 microns thick, and the first and second planes may be vertically spaced by 10-15 microns. The signal vias and capacitive vias may have 10-15 micron diameters, and the signal line capture pads 42 may have 20-30 micron diameters to facilitate alignment with the signal vias. Likewise, the arrays of power and ground vias may consist of four vias with 10-15 micron diameters. Note that the dimensions given are exemplary, and that other factors such as desired voltage drop across a required distance, density requirements, the distance the wiring lines must run in the package and the limits of state of the art thin film lithographic technology influence the ultimate line size required.

Regarding materials, copper is usually the preferred line metal due to its excellent electrical conductivity and its ease of application although aluminum or any other conductive material that is easily deposited is suitable. The best suited metal is normally the metal with the highest electrical conductivity that the manufacturing process can include, and it is generally best to construct all the lines and vias from the same metal. Polyimide is the preferred dielectric although other polymers such as fluorocarbons or siloxanes, epoxies, silicon dioxide and other commonly used insulators are acceptable. Polyimide will be referred to herein because of its excellent dielectric properties and because of the fact that it may be easily applied with state of the art technology.

As previously discussed in the background hereinabove, impedance control is generally provided by microstrip, strip line and co-planar wave guide configurations. The present invention makes advantageous use of both the microstrip and co-planar wave guide techniques. Microstrip impedance control is provided by positioning the signal lines above or below the power and ground lines. For instance, each first signal line 18 is above a plurality of second power lines 30 and second ground lines 32; likewise, each second signal line 28 is below a plurality of first power lines 20 and first ground lines 22. Co-planar wave guide impedance control is provided by positioning the signal lines between and adjacent to the power lines and the ground lines. That is, as may be seen, each first signal line 18 between a pair of first signal lines 18 is between and adjacent to a first power line 20 and a first ground line 22; likewise, each second signal line 28 between a pair of second signal lines 28 is between and adjacent to a second power line 30 and a second ground line 32. While decreasing the spacing between adjacent lines and adjacent planes may improve the co-planar wave guide and microstrip impedance control characteristics, respectively, manufacturing considerations may dictate a lower spacings limit. The optimal spacings may depend on other factors as well such as the desired impedance level and the wire track density.

It is understood that the embodiments described herein are only exemplary. For instance, more generally, the first lines may comprise first signal lines and first power distribution lines wherein a first signal line is between each pair of first power distribution lines and a first power distribution line is between each pair of first signal lines; and likewise, the second lines may comprise second signal lines and second power distribution lines wherein a second signal line is between each pair of second power distribution lines and a second power distribution line is between each pair of second signal lines. While the power distribution lines may be alternating power and ground lines, they may also be any combination of power and ground lines, including solely power lines, ground lines, or some such other constant potential lines. The specific operating voltages depend on the specific packaging application. And not all power lines necessarily need be tied together—for instance two separated sets of power lines could be biased at two different voltage levels, in which case the power vias would not connect all or substantially all of the power lines in separate planes. Furthermore, while the preferred location for the vias is where the lines overlap, the vias may be positioned in other regions as well. Other embodiments are possible wherein the X-level metal is formed on a lower plane and then Y-level metal is formed on a subsequent plane, or wherein the metallization lines on each level run at any suitable angle to each other. The present invention may also include similar aspects set forth in U.S. Pat. No. 4,866,507 to Jacobs et al. which is incorporated herein by reference.

Device 10 is preferably adapted to receive surface-mounted integrated circuit chips and contain bonding pads at the surface which are connected to the signal, power and ground lines in order to provide signal routing and constant potentials for the chips. It is understood however that the additional processing steps in FIGS. 4-6 are optional to the present invention.

Figure 4:
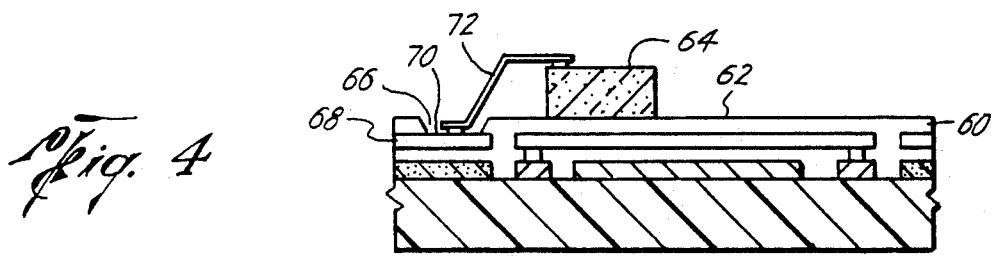
FIG. 4 shows a cross-sectional view of the interconnect device of FIG. 1 further including a polyimide dielectric and top surface with bonding pads.

Referring now to FIG. 4, device 10 is shown in cross-section and further comprises a dielectric such as polyimide 60 on base 12, between adjacent lines and planes, above first plane 14 and generally surrounding the lines and the vias. Polyimide 60 contains top surface 62 with integrated circuit chip 64 mounted thereon. A portion of polyimide 60 is selectively removed to form an opening or through-hole 66. Conventional through-holes would typically be formed by any of reactive ion etching, wet etching or photoimaging of the polyimide. Through-hole 66 exposes line 68 in first plane 14. Line 68 may be a signal, power or ground line. The exposed portion of line 68 provides a bonding (or test or probe) pad 70. Chip 64 is bonded to pad 70 by lead 72. One technique for providing conductive interconnecting metal leads is tape-automated-bonding (TAB). The TAB leads can be fabricated on a continuous carrier film in which the tape is a laminate of copper and a plastic insulator and the leads are etched in the copper while on the plastic carrier using well known etching processes. Or an additive metal fabrication processes can be used. The film is normally perforated along the edges with sprocket holes for use in advancement and alignment of the carrier film. Individual chips can be electrically bonded to individual lead frames in the tape, for instance by laser bonding as described in U.S. Pat. No. 4,845,335 to Andrews et al. entitled "Laser Bonding Apparatus And Method", and the lead frames can be removed or excised from the carrier film. Usually it is necessary to bend or form the leads prior to bonding the outer lead ends to a substrate. Those skilled in the art will appreciate that other means and methods of chip connection may be used, i.e. solder balls or wire bonding.

Figure 5:
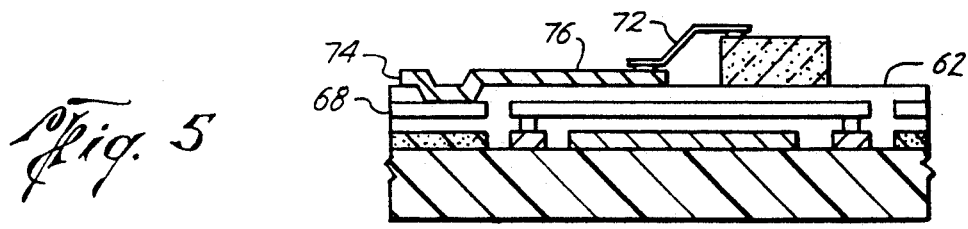
FIG. 5 shows a cross-sectional view of the device of FIG. 4 with additional metallization for bonding pads.

With reference now to FIG. 5, device 10 further includes a patterned section of metal 74 formed on the exposed portion of line 68 and a portion of polyimide top surface 62. Metal 74 may be formed by conventional thin film techniques. The purpose of metal 74 is to provide an enlarged bonding (or test or probe) pad 76 relative to pad 70. This alleviates the precision needed to align lead 72 with the pad prior to bonding.

Figure 6:
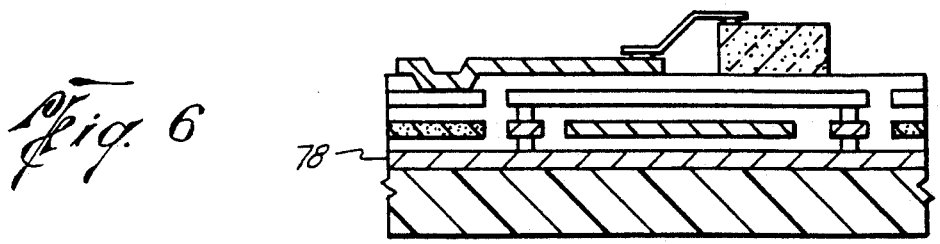
FIG. 6 shows a cross-sectional view of the device of FIG. 5 further including a ground plane.

Referring now to FIG. 6, device 10 may include one or more smooth, flat, unpatterned power distribution layers to be used in conjunction with the interwoven power and ground layers in order to increase the decoupling capacitance as previously discussed. For instance, a power layer 78 may be sandwiched between the second plane 24 and base 12 without a large space penalty or expense. Of course, layer 78 is optional and may in fact be eliminated to so that none of the wiring planes is solely a power or ground plane.

At this point device 10 is in condition to be connected to the next layer of packaging (i.e. board or card), for example, by wiring bonding from the edge of the substrate.

The interconnect device of the present invention can be fabricated using conventional manufacturing techniques that are well known in the art and will not be described in detail herein. For instance, U.S. Pat. No. 5,071,518 by Pan entitled "Method Of Making An Electrical Multilayer Interconnect" describes a method of building up interlayer via pillars on a first layer and then coating the pillars with a dielectric before fabricating the next layer (additive technique). U.S. Pat. No. 5,091,339 by Carey entitled "Trenching Techniques For Forming Vias And Channels In Multilayer Electrical Interconnects" describes a method of forming channels and through-hole vias in a dielectric which can then be filled with metal before planarizing the top surface and fabricating the next layer thereon (subtractive technique). The present invention is also well suited for double sided laminate based implementations.

The present invention, therefore, is well adapted to carry out the objects and attain the ends and advantages mentioned, as well as others inherent therein. While presently preferred embodiments of the present invention have been described for the purpose of disclosure, numerous other changes in the details of construction, arrangement of parts, compositions and materials selection, and processing steps can be carried out without departing from the spirit of the present invention which is intended to be limited only by the scope of the appended claims.

What is claimed is:

1. An electrical interconnect device, comprising:
    a plurality of spaced, parallel, conductive upper lines in an upper horizontal plane comprising upper signal lines and upper power distribution lines wherein an upper signal line is between each pair of upper power distribution lines and an upper power distribution line is between each pair of upper signal lines;
    a plurality of spaced, parallel, conductive lower lines in a lower horizontal plane comprising lower signal lines and lower power distribution lines wherein a lower signal line is between each pair of lower power distribution lines and a lower power distribution lines is between each pair of lower signal lines, and the lower lines are positioned beneath, spaced from and orthogonal to the upper lines;
    a plurality of vertical, conductive vias between and connected to the upper and lower lines comprising signal vias located at selected overlapping regions of the upper and lower signal lines and power distribution vias located at selected overlapping regions of the upper and lower power distribution lines; and
    a plurality of vertical, capacitive vias between and connected to selected upper and lower power distribution lines.

2. The electrical interconnect device according to claim 1, further comprising a top horizontal surface above the upper and lower planes wherein the top surface contains a plurality of bonding pads comprising signal and power distribution bonding pads which are connected to the signal and power distribution lines, respectively.

3. The electrical interconnect device according to claim 2 wherein the device further comprises a plurality of integrated circuits chips mounted on the top surface and connected to the bonding pads.

4. The electrical interconnect according to claim 1 wherein the majority of the surface area for the upper and lower planes is occupied by the upper and lower lines, respectively.

5. The electrical interconnect device according to claim 1 wherein the power distribution lines comprise power lines and ground lines, the power distribution vias comprise power vias located at substantially all overlapping regions of the upper and lower power lines, the power distribution vias further comprise ground vias located at substantially all overlapping regions of the upper and lower ground lines, some capacitive vias are located at substantially all overlapping regions of the upper power lines and lower ground lines, and other capacitive vias are located at substantially all overlapping regions of the upper ground lines and lower power lines.

6. The electrical interconnect device according to claim 5 wherein the upper lines are positioned so as to form a regular pattern of upper signal line, upper power line, upper signal line and upper ground line as traversed in the direction of the lower lines, and the lower lines are positioned so as to form a regular pattern of lower signal line, lower power line, lower signal line and lower ground line as traversed in the direction of the upper lines.

7. The electrical interconnect device according to claim 5, wherein each upper signal line between other upper signal lines is adjacent to an upper power line on one side and an upper ground line on the other side, each upper power line between other upper power lines is adjacent to an upper signal line on both sides, and each upper ground line between other upper ground lines is adjacent to an upper signal line on both sides, and each lower signal line between other lower signal lines is adjacent to a lower power line on one side and a lower ground line on the other side, each lower power line between other lower power lines is adjacent to a lower signal line on both sides, and each lower ground line between other lower ground lines is adjacent to a lower signal line on both sides.

8. The electrical interconnect device according to claim 7 wherein a power via is located between the overlapping regions of each pair of upper and lower power lines, a ground via is located between the overlapping region of each pair of upper and lower ground lines, a capacitive via is located between the overlapping region of each pair of upper power lines and lower ground lines, and a capacitive via is located between the overlapping region of each pair of upper ground lines and lower power lines.

9. The electrical interconnect device according to claim 8 wherein the power and ground lines are at least twice as wide as the signal lines.

10. An electrical interconnect device, comprising:
a plurality of spaced, parallel, metallic first electrical signal lines in an upper horizontal plane;
a plurality of spaced, parallel, metallic lower electrical signal lines in a lower horizontal plane with the lower signal lines positioned beneath, spaced from and orthogonal to the upper signal lines;
a plurality of spaced, parallel, metallic upper power lines in the upper plane arranged parallel to and spaced from the upper signal lines;
a plurality of spaced, parallel, metallic lower power lines in the lower plane arranged parallel to and spaced from the lower signal lines;
a plurality of spaced, parallel, metallic upper ground lines in the upper plane arranged parallel to and spaced from the upper signal and upper power lines;
a plurality of spaced, parallel, metallic lower ground lines in the lower plane arranged parallel to and spaced from the lower signal and lower power lines;
a plurality of conductive, vertical signal vias located between and connecting selected upper and lower signal lines;
a plurality of conductive, vertical power vias located between and connecting the upper and lower power lines;
a plurality of conductive, vertical ground vias located between and connecting the upper and lower ground lines; and
a plurality of vertical capacitive vias, wherein some of the capacitive vias are located between and connecting the upper power lines to the lower ground lines, and other capacitive vias are located between and connecting the upper ground lines to the lower power lines.

11. The electrical interconnect device according to claim 10 wherein each power line between at least two other power lines in the same place is between and adjacent to two signal lines in the same plane, and each ground line between at least two other ground lines in the same plane is between and adjacent to two signal lines in the same plane.

12. The electrical interconnect device according to claim 10 wherein each signal line between at least two other signal lines in the same plane is adjacent to a power line and a ground line in the same plane.

13. The electrical interconnect device according to claim 10 wherein the signal vias are located where the selected upper and lower signal lines overlap, the power vias are located where the upper and lower power lines overlap, the ground vias are located where the upper and lower ground lines overlap, some capacitive vias are located where the upper power lines and lower ground lines overlap, and other capacitive vias are located where the upper ground lines and the lower power lines overlap.

14. The electrical interconnect device according to claim 13 wherein a via is located where every power and ground line overlap.

15. The electrical interconnect device according to claim 10 wherein a dielectric material is filled into the spaces between the lines and the planes outside the vias.

16. The electrical interconnect device according to claim 15 wherein the lines are copper and the dielectric material is polyimide.

17. The electrical interconnect according to claim 10 wherein the majority of the surface area of the upper and lower planes is occupied by the upper and lower lines, respectively.

18. The electrical interconnect device according the claim 10, further comprising a top surface above the upper and lower planes with bonding pads thereon wherein separate bonding pads are connected to at least one signal line, power line and ground line.

19. The electrical interconnect device according to claim 18 wherein the device further comprises a plurality of integrated circuits chips mounted on the top surface and connected to the bonding pads.

20. An electrical electrical interconnect device having a supportive base, alternating insulating and metallization layers, and semiconductor integrated circuit chips mounted thereon, said device comprising:
a supportive base;
a plurality of spaced, elongated, parallel upper electrical signal lines in an upper horizontal plane above the base;
a plurality of spaced, elongated, parallel lower electrical signal lines in a lower horizontal plane above the base wherein the lower signal lines are positioned beneath, spaced from and orthogonal to the upper signal lines;
a plurality of spaced, elongated, parallel upper power lines in the upper plane arranged parallel to and spaced from the upper signal lines, wherein each upper power line between at least two other upper power lines is between and adjacent to two upper signal lines;
a plurality of spaced, elongated, parallel lower power lines in the lower plane arranged parallel to and spaced from the lower signal lines, wherein each lower power line between at least two other lower power lines is between and adjacent to two lower signal lines;

a plurality of spaced, elongated, parallel upper ground lines in the upper plane arranged parallel to and spaced from the upper signal and upper power lines, wherein each upper ground line between at least two other upper ground lines is between and adjacent to two upper signal lines;

a plurality of spaced, elongated, parallel lower ground lines in the lower plane arranged parallel to and spaced from the lower signal and lower power lines, wherein each lower ground line between at least two other lower ground lines is between and adjacent to two lower signal lines;

wherein each upper signal line between at least two other upper signal lines is adjacent to an upper power line and an upper ground line and wherein each lower signal line between at least two other lower signal lines is adjacent to a lower power line and a lower ground line;

wherein each power line and each ground line is wider than each signal line and wherein each signal line is wider than each spacing between adjacent lines in the same plane;

a plurality of conductive, vertical signal vias which connect selected upper and lower signal lines wherein the signal vias are located at the overlapping regions of the selected upper and lower signal lines;

a plurality of conductive, vertical power vias which connect selected upper and lower power lines wherein the power vias are located at the overlapping regions of the selected upper and lower power lines;

a plurality of conductive, vertical ground vias which connect selected upper and lower ground lines wherein the ground vias are located at the overlapping regions of the selected upper and lower ground lines;

a first plurality of capacitive vias which connect selected upper power lines to selected lower ground lines wherein the first plurality of capacitive vias are located at the overlapping regions of the selected upper power lines and lower ground lines;

a second plurality of capacitive vias which connect selected upper ground lines to selected lower power lines wherein the second plurality of capacitive vias are located at the overlapping regions of the selected upper ground lines and lower power lines;

a dielectric material covering the base, surrounding the lines and vias, and having a top surface above the upper and lower planes;

a plurality of bonding pads on the top surface of the dielectric material wherein a first bonding pad is connected to a signal line, a second bonding pad is connected to a power line, and a third bonding pad is connected to a ground line; and a plurality of integrated circuits chips mounted on the top surface of the dielectric and connected to the bonding pads.

21. The electrical interconnect device according to claim 20 wherein any metallization in a horizontal plane within the device is connected to the upper and lower signal lines, thereby preventing the metallization from functioning solely as a ground plane or a power plane.

22. The electrical interconnect device according to claim 20, further comprising a smooth, flat, unpatterned horizontal power distribution layer above the base.

23. The electrical interconnect device according to claim 20 wherein the lines and the signal, power and ground vias are continuous copper wiring, the dielectric is polyimide and the chips are connected to the bonding pads by tape-automated-bonding leads.

* * * * *

UNITED STATES PATENT AND TRADEMARK OFFICE
CERTIFICATE OF CORRECTION

PATENT NO. : 5,272,600
DATED : December 21, 1993
INVENTOR(S) : David Carey

It is certified that error appears in the above-indentified patent and that said Letters Patent is hereby corrected as shown below:

Column 2, line 9, change "geometies" to -- geometries --.
    Column 3, line 25, change "course" to -- coarse --.
    Column 7, line 29-30, change "titante" to -- titanate --.
    Column 9, line 14, change "processes" to -- process --.
    Column 9, line 44, delete "to" after "eliminated".
    Column 10, line 24, change "lines" to -- line --.
    Column 10, line 46, change "circuits" to -- circuit --.
    Column 12, line 7, change "place" to -- plane --.
    Column 12, line 46, change "circuits" to -- circuit --.
    Column 12, line 48, delete "electrical" after "An".
    Column 14, line 23, change "circuits" to -- circuit --.

Signed and Sealed this

Sixth Day of September, 1994

Attest:

BRUCE LEHMAN

Attesting Officer      Commissioner of Patents and Trademarks